United States Patent [19]

Imamura et al.

[11] Patent Number: 5,214,297
[45] Date of Patent: May 25, 1993

[54] HIGH-SPEED SEMICONDUCTOR DEVICE

[75] Inventors: Kenichi Imamura; Naoki Yokoyama; Toshio Ohshima, all of Atsugi, Japan

[73] Assignee: Fujitsu Limited, Kawasaki, Japan

[21] Appl. No.: 921,365

[22] Filed: Jul. 28, 1992

Related U.S. Application Data

[63] Continuation of Ser. No. 664,517, Mar. 5, 1991, abandoned, which is a continuation of Ser. No. 415,200, Sep. 27, 1989, abandoned, which is a continuation of Ser. No. 165,383, Feb. 29, 1988, abandoned, which is a continuation of Ser. No. 798,285, Nov. 15, 1985, abandoned.

[30] Foreign Application Priority Data

Nov. 19, 1984 [JP] Japan .................. 59-242412

[51] Int. Cl.$^5$ .............. H01L 29/72; H01L 27/12; H01L 29/161
[52] U.S. Cl. .................. 257/191; 257/197
[58] Field of Search ............. 357/4, 34

[56] References Cited

U.S. PATENT DOCUMENTS

| | | | |
|---|---|---|---|
| 4,149,174 | 4/1979 | Shannon | 357/34 |
| 4,286,275 | 8/1981 | Heiblum | 357/4 |
| 4,353,081 | 10/1982 | Allyn et al. | 357/16 |
| 4,518,979 | 5/1985 | Dumke et al. | 357/30 |
| 4,712,121 | 12/1987 | Yokoyama | 357/34 |

FOREIGN PATENT DOCUMENTS 0159273 10/1985 European Pat. Off. ......... 357/45 L

OTHER PUBLICATIONS

I.B.M. Tech. Discl. Bull. vol. 27 No. 12, May 1985 "Semiconductor Hot Electron Transistor with Resonant Tunneling Emitter", p. 7175.

Muller & Kamins "Device Electronics for Integrated Circuits" ©1986 p. 309.

"Resonant Tunneling Through Quantum Wells at Frequencies up to 2.5 THz" Applied Physics Letters, vol. 43, No. 6, Sep. 15, 1983, pp. 588–590.

"Resonant Tunneling in Semiconductor Double Barriers" Applied Physics Letters vol. 24, No. 12, Jun. 15, 1984, pp. 593–595.

"Graded Collector Heterojunction Bipolar Transistor" Applied Physics Letters, vol. 44, No. 1, Jan. 1, 1984, pp. 105–106.

Primary Examiner—Jerome Jackson
Assistant Examiner—D. Monin
Attorney, Agent, or Firm—Staas & Halsey

[57] ABSTRACT

A high-speed semiconductor device comprising emitter potential barrier layer disposed between an emitter layer and a base layer, a collector layer, and a collector potential barrier layer disposed between the base layer and the collector layer. The collector potential barrier layer has a structure having a barrier height changing from a high level to a low level along the direction from the base layer to the collector layer, whereby, even when no bias voltage is applied between the collector layer and the emitter layer, a collector current can flow through the device.

5 Claims, 6 Drawing Sheets

HIGH-SPEED SEMICONDUCTOR DEVICE

This application is a continuation of application No. 07/664,517, filed Mar. 5, 1991, now abandoned, which is a continuation of Ser. No. 07/415,200, filed Sep. 27, 1989, now abandoned; which is a continuation of Ser. No. 7/165,383, filed Feb. 29, 1988, abandoned; which is a continuation of Ser. No. 06/798,285, filed Nov. 15, 1985, abandoned.

BACKGROUND OF THE INVENTION (1) Field of the Invention

The present invention relates to an improvement in a high speed semiconductor device known as a hot electron transistor (HET).

(2) Description of the Related Art

Examples of the related references in the field are as follows:

"Resonant Tunneling in Semiconductor Double Barriers", by L. L. Chang, L. Esaki, and R. Tsu, in Applied Physics Letters, Vol. 24, No. 12, Jun. 15, 1974;

Japanese Unexamined Patent Publication (Kokai) No. 58-3277 published on Jan. 10, 1983, Applicant: International Business Machines Corporation, Inventor: L. Esaki, claiming priority based on U.S. application Ser. No. 280,141 filed on Feb. 5, 1982;

"Characterization of Double Heterojunction GaAs/AlGaAs Hot Electron Transistors", N. Yokoyama, et al. PROCEEDINGS OF THE IEEE INTERNATIONAL ELECTRON DEVICES MEETING, Dec. 1984, pp 532 to 535; and U.S. application Ser. No. 754,416, filed Jul. 12, 1985 or European Patent Application No. 85401440.4, filed Jul. 15, 1985.

In recent years, due in part to advances made in molecular beam epitaxy (MBE) technology, there has been active development of semiconductor devices using heterojunctions. Among the same, considerable expectations are placed on HET's as high speed semiconductor devices, since hot electrons are used in the HET's as carriers and thus the transit time of the hot electrons through the base is drastically shortened (U.S. application Ser. No. 722,053, filed Apr. 11, 1985, U.S. application Ser. No. 796,406, filed Nov. 8, 1985, or European Patent Application No. 85400744.0, filed Apr. 16, 1985).

HET's prior to the present invention, however, contain the problems of high power consumption and low switching speed, because the lowest collector-emitter voltage for conducting current through the HET is relatively high.

SUMMARY OF THE INVENTION

An object of the present invention is to improve the power consumption characteristic of an HET.

Another object of the present invention is to improve the switching speed characteristic of an HET.

To attain the above objects there is provided, according to the present invention, a high-speed semi-conductor device comprising an emitter layer, a base layer, a collector layer, and a collector potential barrier layer disposed between said base layers and said collector layer. The collector potential barrier layer has a structure having a barrier height changing from a high level to a low level along the direction from the base layer to the collector layer.

BRIEF DESCRIPTION OF THE DRAWINGS

The above objects and features of the present invention will be more apparent from the following description of the preferred embodiment with reference to the attached drawings, wherein.

DESCRIPTION OF THE PREFERRED EMBODIMENTS

Before describing the embodiments of the present invention, a prototype HET developed prior to the present invention and the problems therein will be described with reference to FIGS. 1A through 1C and FIG. 2.

Figure 1A:
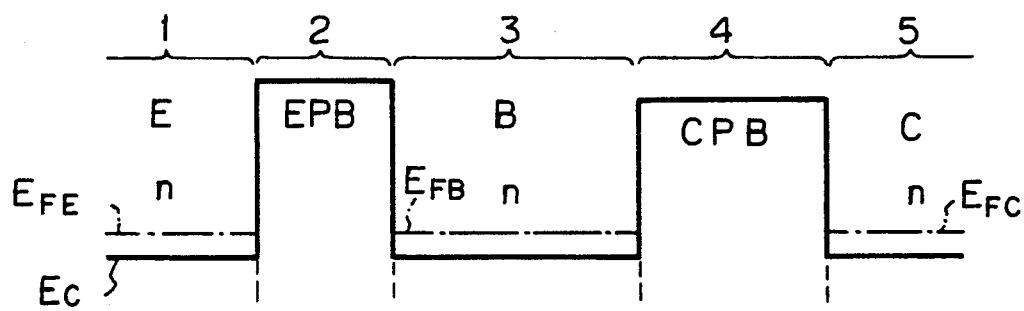
FIG. 1A is an energy band diagram in a thermal equilibrium state of a prototype HET developed prior to the present invention.
Figure 1B:
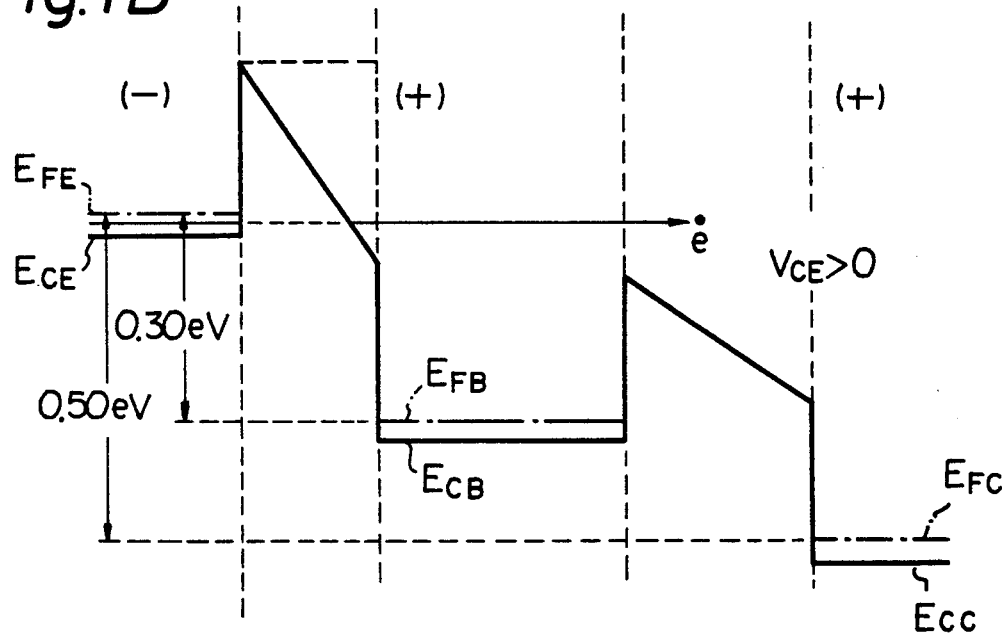
FIG. 1B is an energy band diagram in an operating state of the FIG. 1A prototype HET.
Figure 1C:
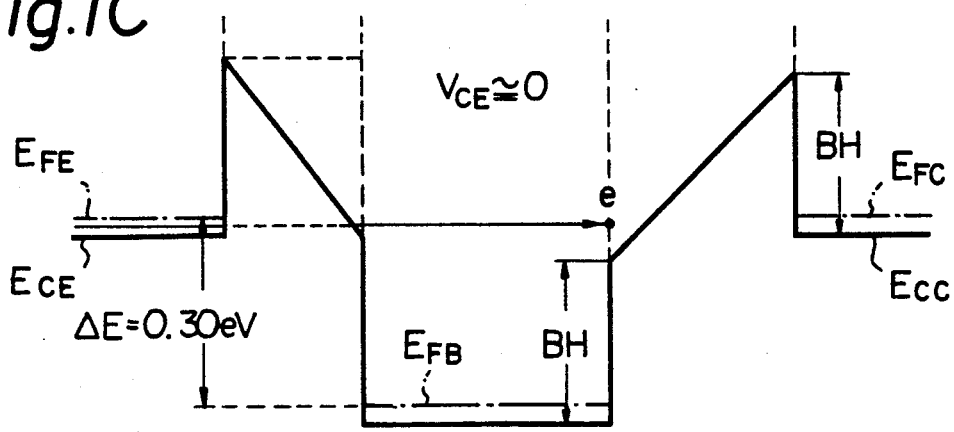
FIG. 1C is an energy band diagram showing a state when the collector-emitter voltage $V_{CE}$ is zero in the FIG. 1A prototype HET.

FIGS. 1A through 1C are energy band diagrams in a thermal equilibrium state, in an operating state, and in a state when $V_{CE}$ is zero, respectively, of a prototype HET developed prior to the present invention. The prototype HET has five layers, i.e., an n type GaAs emitter layer (E) 1, a non-doped AlGaAs emitter potential barrier layer (EPB) 2, an n type GaAs based layer (B) 3, a non-doped AlGaAs collector side potential barrier layer (CPB) 4, and an n type GaAs collector layer (C) 5. In the FIGS. 1A through 1C, the diagrams represent the lowest energy level $E_C$ of the conduction band in respective layers.

In the thermal equilibrium state, since no voltage is applied between the emitter layer 1 and the base layer 3 or between the emitter layer 1 and the collector layer 5, the Fermi levels $E_{FE}$, $E_{FB}$, and $E_{FC}$ in the emitter layer 1, in the base layer 3, and in the collector layer 5 are the same as each other, as shown in FIG. 1A.

In such an HET, a positive bias voltage $V_{CE}$ is applied between the collector layer 5 and the emitter layer 1, and a positive bias voltage $V_{BE}$ is applied between the base layer 3 and the emitter layer 1 so that the base Fermi level $E_{FB}$ is lowered by, for example, 0.30 eV, from the emitter Fermi level, and the collector Fermi level EFC is lowered by, for example, 0.50 eV, from the emitter Fermi level. The energy band diagram in this state is shown in FIG. 1B. Due to the positive bias voltages, the gradient of the energy level in the emitter potential barrier layer 2 or in the collector potential barrier layer 4 becomes larger. As a result of the larger gradient in the emitter potential barrier layer 2, the emitter barrier becomes thinner. Thus, electrons injected from the emitter layer 1 can tunnel through the emitter potential barrier 2 to be injected in the base layer 3. There, the potential energy held by the electrons e is converted to kinetic energy so that the electrons become high-speed hot electrons. Since the collector potential barrier layer 4 is also lowered and has a gradient due to the lowered energy levels of the base Fermi level $E_{FB}$ and the collector Fermi level $E_{FC}$, the hot electrons can pass through the collector potential barrier layer 4 to be injected into the collector layer 5 without scattering.

In the conventional HET, however, problems arise when the collector-emitter voltage $V_{CE}$ is close to zero, as shown in FIG. 1C. That is, since the emitter Fermi level $E_{FE}$ and the collector Fermi level $E_{FC}$ are equal in this case, and the collector potential barrier layer 4 has a height BH from the lowest level of the collector conduction band $E_{CC}$, the kinetic energy of the hot electrons in the base layer is lower than the barrier height BH from the collector conduction band $E_{CC}$. Therefore, the hot electrons cannot pass through the collector potential barrier 4. More specifically, if the collector potential barrier layer 4 comprises intrinsic-type $Al_{0.3}Ga_{0.7}As$, the barrier height BH there would be approximately 0.3 eV. Since the thickness of the emitter potential barrier layer 2 would be 250 to 500° Å (25 nm to 50 nm), and the thickness of the collector side potential barrier layer 4 would be 1500 to 2000° Å (150 nm to 200 nm), in the state where the collector emitter voltage $V_{CE}$ is close to zero, even if a base emitter voltage $V_{BE}$ were applied to give the level difference $\Delta E$ of 0.30 eV, the electrons would tunnel through the emitter potential barrier layer 2, but could not cross the collector potential barrier layer 4.

Figure 2:
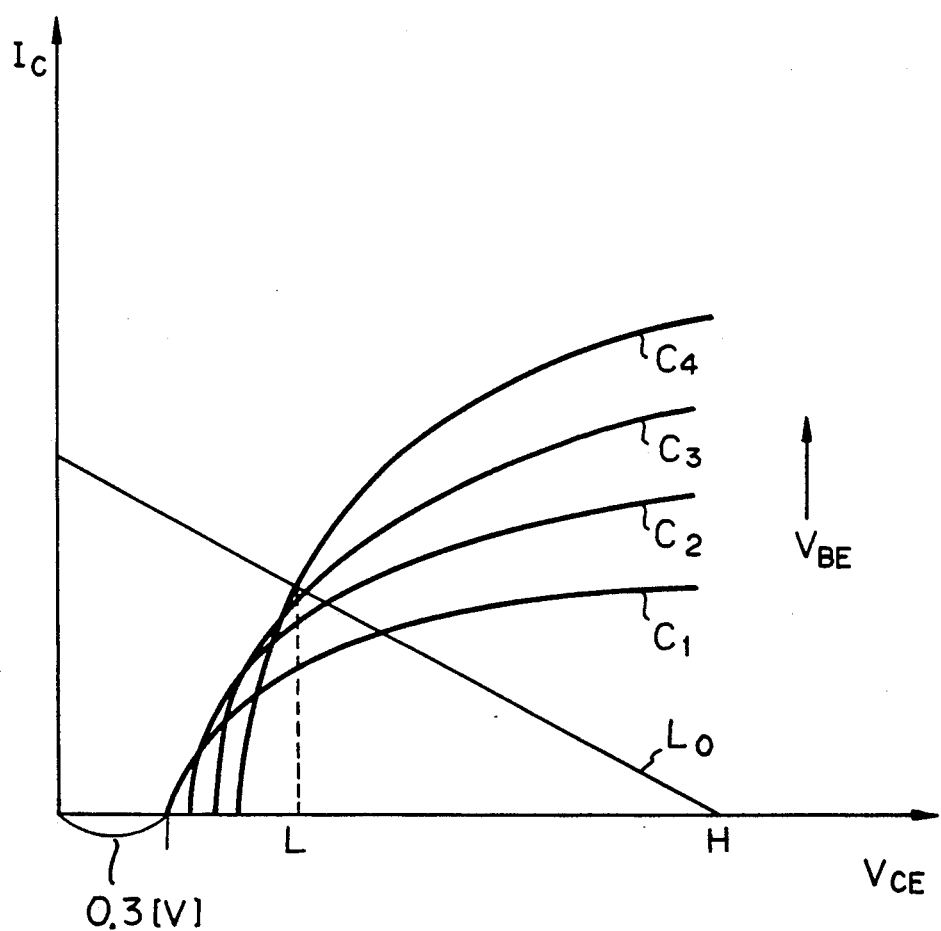
FIG. 2 is a graph illustrating a relationship between the collector-emitter voltage $V_{CE}$ and the collector current $I_C$ in the FIG. 1A HET.

FIG. 2 is a graph showing the relationship between the collector emitter voltage $V_{CE}$ and the collector current $I_C$ in the prototype HET.

In the figure, the horizontal axis indicates the collector emitter voltage $V_{CE}$ and the vertical axis the collector current $I_C$. $C_1$ through $C_4$ are curves representing voltage-current characteristics. $L_0$ represents a load line.

As may be judged from the figure, when the collector emitter voltage $V_{CE}=0$, no collector current $I_C$ flows. It only begins to flow when a voltage of the barrier height BH=0.3 eV, i.e., a voltage which enables electrons to overcome of $V_{CE}=0.3$ V or more, is applied. Further, if the base emitter voltage $V_{BE}$ is raised, the collector emitter voltage $V_{CE}$ necessary to generation collector current $I_C$ shifts. Further, if the base emitter voltage $V_{BE}$ is raised, the electrons in the emitter layer 1 would tunnel through at a location close to the bottom of the conduction band. Therefore, to generate a collector current $I_C$ under such a state, the collector emitter voltage $V_{CE}$ would have to be further increased.

In general, in this type of semiconductor device, if the collector current $I_C$ can flow regardless of the collector emitter voltage $V_{CE}$ being low, the switching speed can naturally be improved and the power consumption reduced.

In addition, when the prototype HET is used as a logic element in a logic circuit, the low output level L is too high as will be seen from the intersection of load line $L_0$ with one of the curves $C_1$ through $C_4$. Therefore, when the prototype HET is used as a logic element in a logic circuit, a level shift circuit to lower the low output level is needed.

The present invention enables generation of a collector current $I_C$ even when the collector emitter voltage $V_{CE}$ is almost zero.

In the high speed semiconductor device of the present invention, the value x at the nondoped $Al_xGa_{1-x}As$ collector potential barrier layer existing between the base layer and collector layer is gradually reduced from the base layer to the collector layer side for a so-called grading state.

With the above-mentioned structure, the barrier height BH at the collector potential barrier layer is gradually reduced from the base layer side to the collector layer side, so even when the collector emitter voltage $V_{CE}$ is close to almost zero, if the base emitter voltage $V_{BE}$ is applied, electrons tunneling from the emitter layer through the emitter side potential barrier layer for injection into the base layer will be able to cross the collector side potential barrier layer and reach the collector layer without hindrance.

Embodiments of the present invention will be described in the following.

Figure 3:
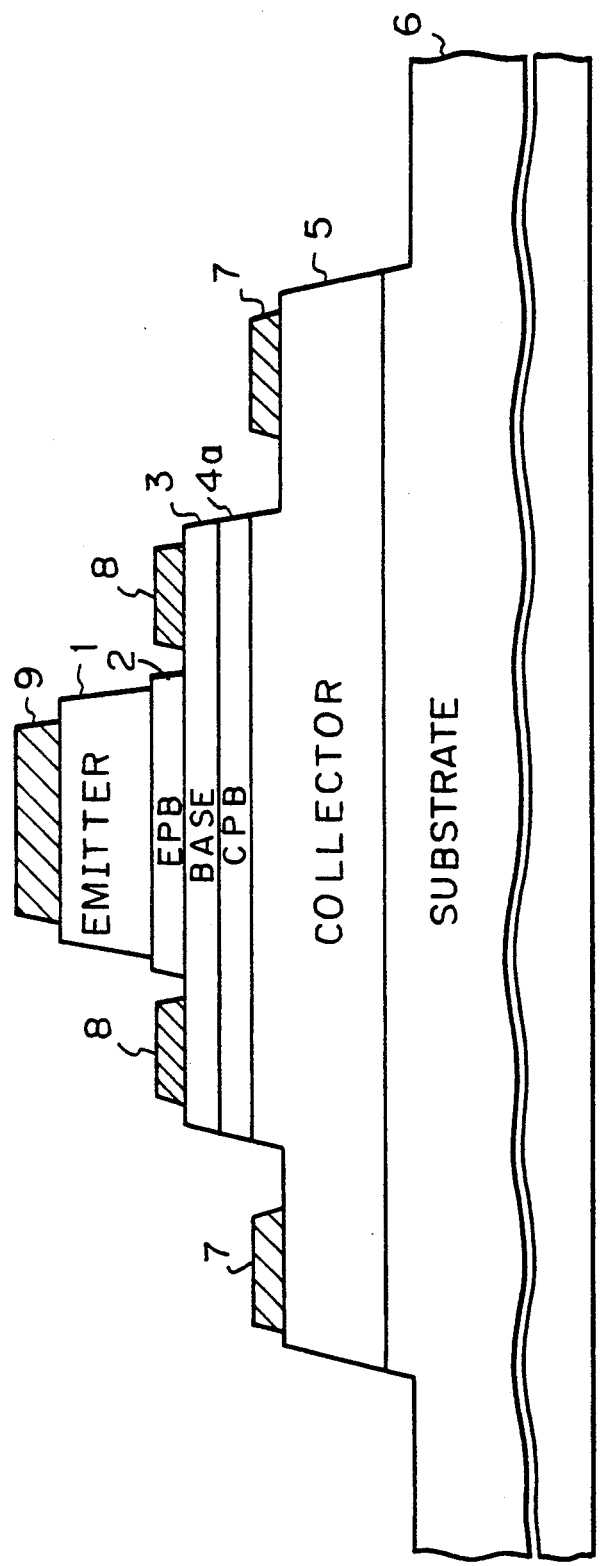
FIG. 3 is a cross-sectional view of an HET according to an embodiment of the present invention.

FIG. 3 is a cross-sectional view of an HET according to an embodiment of the present invention. In FIG. 3, reference numerals 1, 2, 3, and 5 represent the emitter layer, the emitter potential barrier layer, the base layer, and the collector layer, respectively, which are the same as in the prototype HET. According to the embodiment of the present invention, a new collector potential barrier layer 4a is provided.

The collector layer 5 is formed on a semi-insulating GaAs substrate 6, the collector-potential barrier (CPB) layer 4a is formed on the collector layer 5, the base layer 3 is formed on the CPB 4a, and the emitter-potential barrier (EPB) layer 2 is formed on the base layer 3. The emitter layer 1 is formed on the emitter-potential barrier layer 2, and a collector electrode 7 made of gold.germanium/gold (Au.Ge/Au) is formed on the collector layer 5 so as to be in ohmic contact with the collector layer 5. The notation Au.Ge/Au represents a state wherein an alloy Au.Ge is covered by a layer of Au. A base electrode 8 made of gold.germanium/gold (Au.Ge/Au) is formed on the base layer 3 so as to be in ohmic contact with the base layer 3. The term Au.Ge/Au represented a state wherein an alloy Au.Ge is covered by a layer of Au. An emitter electrode 9 made of gold.germanium/gold (Au.Ge/Au) is formed on the emitter layer 1 so as to be in ohmic contact with the emitter layer 1.

Examples of the combination of the material in the embodiment shown in FIG. 3 are as follows.

EXAMPLE 1

Emitter layer 1: GaAs
Emitter potential barrier layer 2: $Al_yGa_{1-y}As$, where y is a constant, e.g., 0.3
Base layer 3: GaAs
Collector potential barrier layer 4a: $Al_xGa_{1-x}As$, where x is variable
Collector layer: GaAs

EXAMPLE 2

Emitter layer 1: GaAs
Emitter potential barrier layer 2: $Al_yIn_{1-y}As$, where y is a constant, e.g., 0.47
Base layer 3: $In_zGa_{1-z}As$, where z is a constant, e.g., 0.53

Collector potential barrier layer 4a: $Al_xIn_{1-x}As$, where x is variable

Collector layer 5: GaAs

In this example, the value x should be smaller than the value y.

Figure 4A:
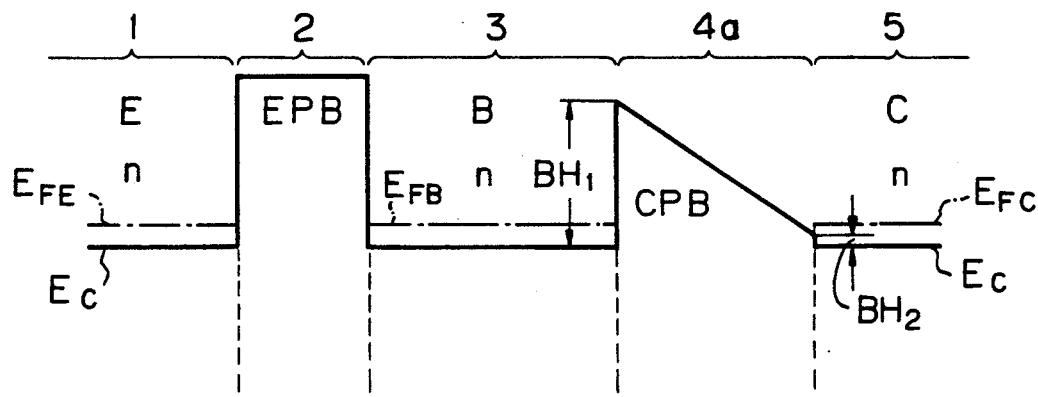
FIG. 4A is an energy band diagram showing a thermal equilibrium state of the HET FIG. 3.

FIG. 4A is an energy band diagram of the HET of the embodiment shown in FIG. 3 in a thermal equilibrium state. As will be seen from the comparison of FIGS. 1A and 4A, the conduction band in the collector-potential barrier layer 4a in this embodiment has a structure having a barrier height changing from a high level to a low level along the direction from the base layer 3 to the collector layer 5. That is, the barrier height between the base layer 3 and the collector potential barrier layer 4a is $BH_1$, which is as high as, for example, 0.30 eV. The barrier height $BH_1$ may or may not be the same as the barrier height of the emitter potential barrier layer 2. In FIG. 4A, the barrier height $BH_1$ is shown as being lower than the barrier height of the emitter potential barrier layer 2. On the contrary, the barrier height between the collector potential barrier layer 4a and the collector layer 5 is $BH_2$, which is a value smaller than the potential barrier of the emitter potential barrier layer 2 and higher than the lowest energy level $E_{CC}$ of the conduction band in the collector layer 5. The potential barrier in the layer 4a linearly decreased from $BH_1$ to $BH_2$.

In the figure, the value x at the intrinsic type $Al_xGa_{1-x}As$ collector potential barrier layer 4a is reduced from the base layer 3 side to the collector layer 5 side, whereby a grading state is achieved. By doing so, the potential barrier also falls, as illustrated.

Figure 4B:
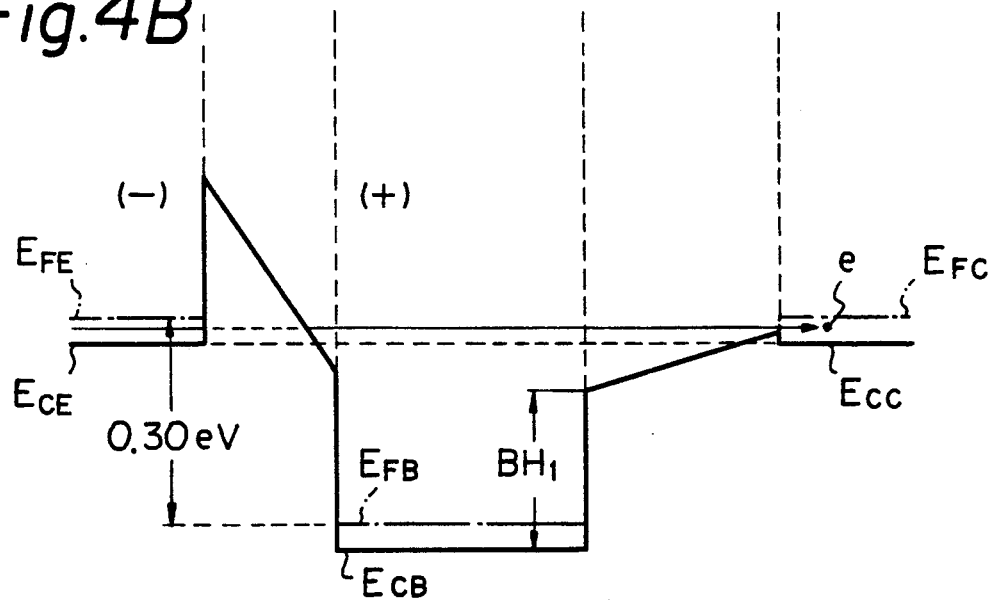
FIG. 4B is an energy band diagram in an operating state of the HET of FIG. 4A.

FIG. 4B is an energy band diagram illustrating the HET according to an embodiment of the present invention in an operating state. In FIG. 4B, a positive bias voltage $V_{BE}$ is applied between the base layer 3 and the emitter layer 1 so that the base Fermi level $E_{FB}$ is lowered by, for example, 0.30 eV, from the emitter Fermi level $E_{FE}$. The lowest energy level $E_{CB}$ of the base conduction band is also lowered by 0.3 eV from the energy level $E_{CE}$. In this embodiment, no voltage is applied between the collector layer 5 and the emitter layer 1. Therefore, the lowest energy level $E_{CE}$ of the conduction band of the emitter layer 1 is the same as the lowest energy level $E_{CC}$ of the conduction band of the collector layer 5. Accordingly, the collector potential barrier layer 4a is lowered to be lower than the lowest energy level $E_{CC}$ of the collector conduction band. Each of the electrons e tunneling from the emitter layer 1 through the emitter potential barrier layer 2 to the base layer 3 has a kinetic energy higher than the energy level $E_{CE}$ or $E_{CC}$. Since the collector potential barrier layer 4a does not act as a potential barrier for the electrons having the energy higher than $E_{CC}$ or $E_{CE}$, the hot electrons in the base layer 3 will easily cross the collector potential barrier layer 4 and reach the collector layer 5.

The collector potential barrier layer 4a in FIG. 4B does not act as a potential barrier but acts as a PN junction, such as that in a conventional bipolar transistor, for insulating the base layer 3 from the collector layer 5.

The barrier height $BH_2$ at the collector layer 5 side is determined to be as small as possible as long as electrons in the collector layer 5 do not enter the base layer 3 due to thermal diffusion.

If the value x at the intrinsic type $Al_xGa_{1-x}As$ collector potential barrier layer 4a is made 0.3 at the base layer 3 side and 0.1 to 0.2 at the collector layer 5 side, the barrier height $BH_1$ of the base layer 3 side at the collector side potential barrier layer 4a will be 0.3 eV and the barrier height $BH_2$ of the collector layer 5 side will be 0.1 to 0.2 eV.

Figure 5:
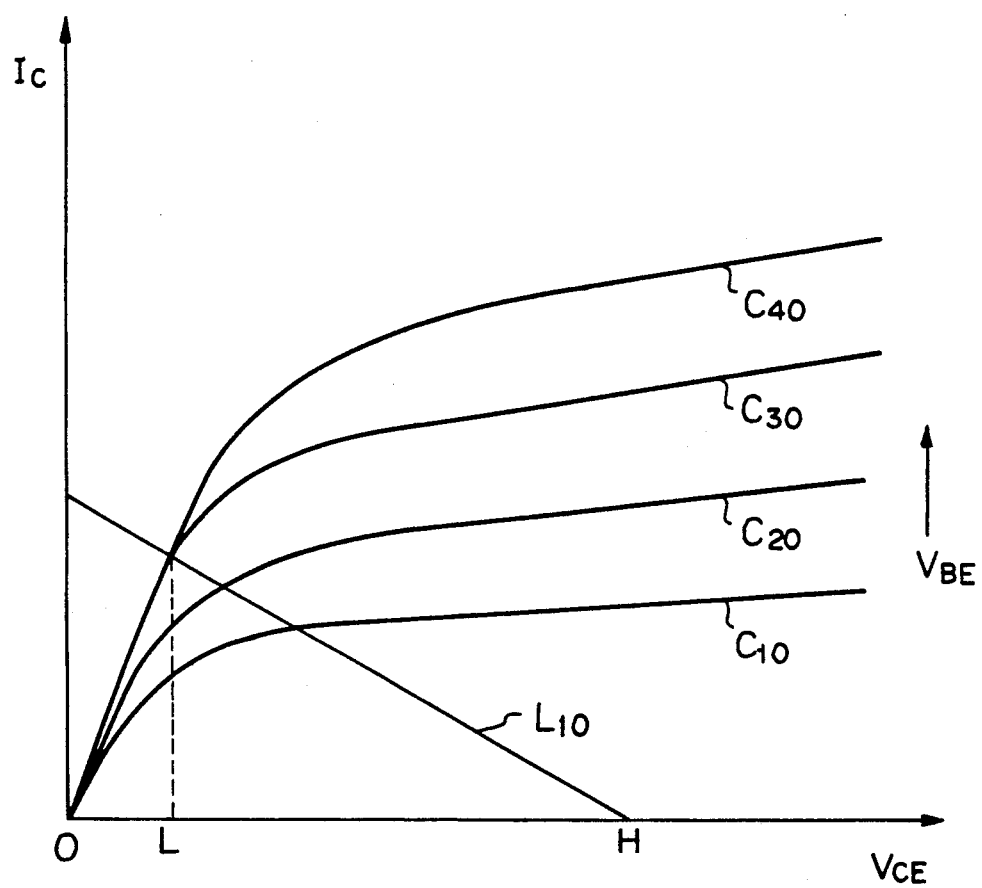
FIG. 5 is a graph illustrating a relationship between the collector-emitter voltage $V_{CE}$ and the collector current $I_C$ in the HET of FIG. 4B.

FIG. 5 is a graph showing the relationship between the collector emitter voltage $V_{CE}$ and the collector current $I_C$ according to an embodiment of the present invention in the state as shown in FIG. 4B.

In the figure, the horizontal axis indicates the collector emitter voltage $V_{CE}$ and the vertical axis the collector current $I_C$.

As can be understood from the figure, a collector current $I_C$ begins to flow even when the collector emitter voltage $V_{CE}=0$. Further, even if the base emitter voltage $V_{BE}$ is made high, there is almost no shifting of the lowest collector emitter voltage $V_{CE}$ for conducting a collector current $I_C$. Therefore, the switching speed can be improved and the power consumption reduced.

Further, the low output L shown in FIG. 5 is sufficiently low in comparison with the conventional low output shown in FIG. 2. Therefore, the HET according to the embodiment of the present invention is convenient for use in a logic circuit, since no level shift circuit is necessary.

To change the structure of the intrinsic type $Al_xGa_{1-x}As$ collector side potential barrier layer as in the present invention, the content of Al in the crystalline layer may be gradually changed or the MBE method may be applied to form superimposed films of intrinsic type $Al_xGa_{1-x}As$ with different x values.

Further, when reducing the height of the potential barrier from the base layer side to the collector layer side as mentioned above, there is some cause for concern with the withstand voltage between the collector and base. The withstand voltage when the collector layer is made positive in potential, however, must be more than the power supply voltage at the circuit. When made negative in potential, however, it may be about the same as the withstand voltage between the base and emitter. Therefore, the problem of withstand voltage is not an immediate concern.

Figure 6A:
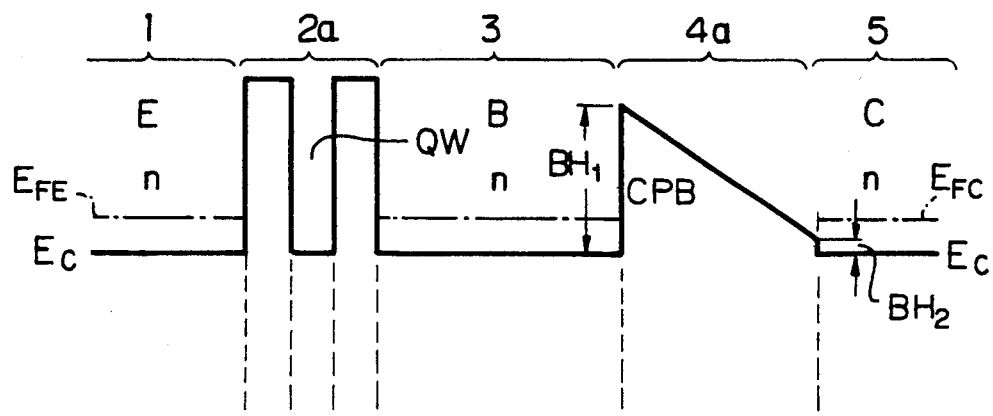
FIG. 6A is an energy band diagram showing a thermal equilibrium state of an HET according to another embodiment of the present invention.
Figure 6B:
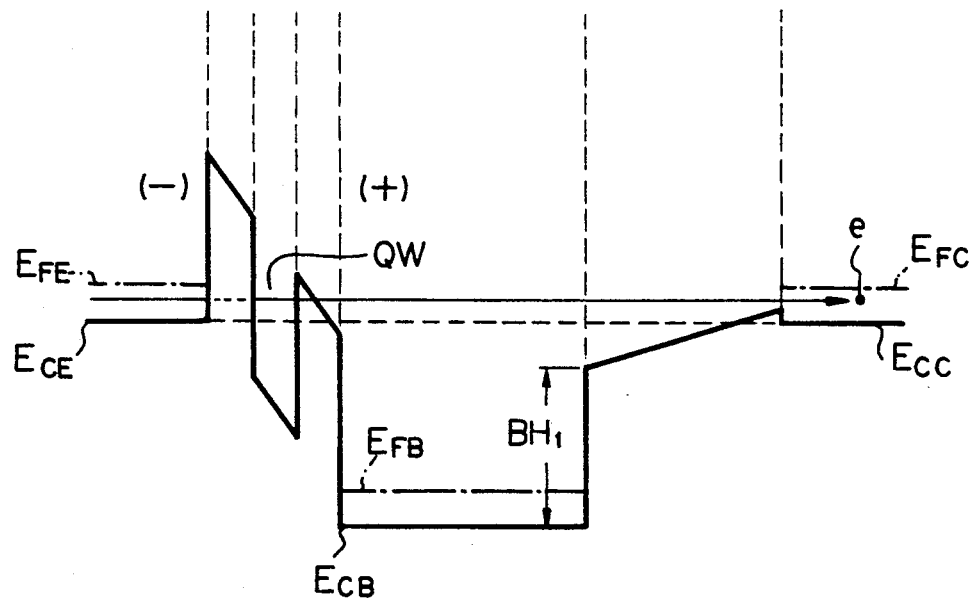
FIG. 6B is an energy band diagram showing an operating state of the HET of FIG. 6A.

FIG. 6A and 6B show another embodiment of the present invention. As shown in FIG. 6A, another emitter potential barrier layer 2a is employed in this embodiment. The emitter potential barrier layer 2a has at least one quantum well QW known as a superlattice. The quantum well QW is made of, for example, GaAs. Both emitter barrier layers $2a_1$ and $2a_2$ adjacent to the quantum well QW are made of $Al_xGa_{1-x}As$, where x is a value equal to 0.33. The value x in the layers $2a_1$ and $2a_2$ must be greater than a value y in $Al_yGa_{1-y}As$ in the collector potential barrier layer 4a.

The resonant tunneling through the quantum well QW itself is a prior art and is described in, for example, "Resonant tunneling through quantum wells at frequencies up to 2.5 THz", by T. C. L. G. Sollner, et al., Appl. Phys. Lett. 43 (6), Sep. 15, 1983 pp 588-590.

By employing the quantum-well structure, or the superlattice, the so-called resonant tunneling is carried out near the Fermi level. Therefore, the tunneling effect through the emitter potential barrier layer 2a is carried out more effectively in comparison with the first embodiment shown in FIG. 4A. The resonant hot electron transistor (RHET) has already been developed (see U.S. application Ser. No. 754,416, or European Patent Application No. 85401440.4).

In the embodiment shown in FIGS. 6A and 6B, the superlattice structure is applied to the emitter potential barrier layer 2a. The operation of the resonant hot electron transistor employing the graded collector potential barrier layer 4a is very similar to the operation as described with reference to FIG. 4B. Therefore, the description for the operation with reference to FIG. 6B is omitted here.

With the above-mentioned constitution, the barrier height at the collector potential barrier layer is gradually reduced from the base layer side to the collector layer side, so even when almost no the collector emitter voltage is applied, electrons tunneling from the emitter layer through the emitter potential barrier for injection into the base layer will be able to cross the collector side potential barrier layer and reach the collector layer without any hindrance.

Therefore, even when the collector emitter voltage is almost zero, a collector current can flow immediately upon application of the base emitter voltage. As a result, the switching speed can be improved and the power consumption reduced.

We claim:

1. A high-speed semiconductor deice comprising:
   an emitter semiconductor layer having a first conductivity type;
   a base semiconductor layer formed under said emitter semiconductor layer and having the first conductivity type;
   an emitter potential barrier layer disposed between said emitter semiconductor layer and said base semiconductor layer, said emitter potential barrier layer being formed so that electrons tunnel therethrough;
   a collector semiconductor layer formed under said base semiconductor layer and having the first conductivity type;
   a collector potential barrier layer disposed between said base semiconductor layer and said collector semiconductor layer, said collector potential barrier layer having a barrier height such that a first barrier height at aid base semiconductor layer is larger than a second barrier height at said collector semiconductor layer, the second barrier height being greater than zero, and a bandgap of said collector potential barrier layer decreasing in a direction from said base semiconductor layer toward said collector semiconductor layer when said semiconductor device is in thermal equilibrium; and
   bias means for applying a bias voltage between said emitter and base semiconductor layers such that a maximum level of said barrier heights is less than a kinetic energy level of hot electrons tunnelling from said emitter semiconductor layer trough said emitter potential barrier layer to said base semiconductor layer when said bias voltage is applied between said base layer and said emitter semiconductor layer even when said collector semiconductor layer and said emitter semiconductor layer have energy levels which are close to each other.

2. A high-speed semiconductor device as set forth in claim 1, wherein said collector potential barrier layer comprises non-doped $Al_xGa_{1-x}As$, where the value x is gradually decreased from a first value at said base semiconductor layer side to a second value at said collector semiconductor layer side.

3. A high-speed semiconductor device as set forth in claim 1, wherein said collector potential barrier layer comprises non-doped $Al_xIn_{1-x}As$, where x is gradually decreased from a first value at said base semiconductor layer side to a second value at said collector semiconductor layer side.

4. A high-speed semiconductor device as set forth in claim 1, wherein said emitter potential barrier layer has at least one quantum well, wherein passage of said hot electrons from said emitter semiconductor layer to said base semiconductor layer is effected by resonant tunnelling.

5. A high-speed semiconductor device comprising:
   a semiconductor substrate;
   a collector semiconductor layer formed on said semiconductor substrate and having a first conductivity type;
   a collector potential barrier layer formed on said collector semiconductor layer;
   a base semiconductor layer formed on said collector potential barrier layer having the first conductivity type, said collector potential barrier layer having a barrier height such that a first barrier height at said base semiconductor layer is larger than a second barrier height at said collector semiconductor layer, the second barrier height being greater than zero, and said barrier height decreasing in a direction from said base semiconductor layer toward said collector semiconductor layer when said semiconductor device is in thermal equilibrium;
   an emitter potential barrier layer formed on a portion of said base semiconductor layer, said emitter potential barrier layer being formed so that electrons can tunnel therethrough;
   an emitter semiconductor layer formed on said emitter potential barrier layer and having the first conductivity type; and
   bias means for applying a bias voltage between said emitter and base semiconductor layers such that a maximum barrier height is lower than a kinetic energy level of hot electrons tunnelling from said emitter semiconductor layer through said emitter potential barrier layer to said base semiconductor layer when said bias voltage is applied between said base semiconductor layer and said emitter semiconductor layer even when said collector layer and said emitter semiconductor layer have energy levels which are close to each other.

* * * * *

UNITED STATES PATENT AND TRADEMARK OFFICE
CERTIFICATE OF CORRECTION

PATENT NO. : 5,214,297
DATED : MAY 25, 1993
INVENTOR(S) : KENICHI IMAMURA ET AL.

It is certified that error appears in the above-indentified patent and that said Letters Patent is hereby corrected as shown below:

Col. 2, line 21, "HET FIG. 3" should be --FIG. 3 HET--.

Col. 3, line 48, "voltage" should be --voltage, which enables electrons to overcome--;
line 48, "of" should be deleted;
line 49, "which enables elec-" should be deleted;
line 50, "trons" should be deleted;
line 52, "generation" should be --generate a--.

Col. 4, line 10, "layer" (first occurrence) should be --layer side--
line 16, "almost" should be deleted.

Col. 5, line 26, "decreased" should be --decreases--.

Col. 6, line 14, "$V_{CE} = C$" should be --$V_{CE} \doteq C$--;
line 42, "FIG. 6A and 6B" should be --FIGS. 6A and 6B--.

UNITED STATES PATENT AND TRADEMARK OFFICE
CERTIFICATE OF CORRECTION

PATENT NO. : 5,214,297
DATED : May 25, 1993
INVENTOR(S) : KENICHI IMAMURA ET AL.

It is certified that error appears in the above-indentified patent and that said Letters Patent is hereby corrected as shown below:

Col. 7, line 10, "the" should be deleted.

Signed and Sealed this

Twenty-ninth Day of March, 1994

Attest:

BRUCE LEHMAN

Attesting Officer

Commissioner of Patents and Trademarks